(12) United States Patent
Takizawa et al.

(10) Patent No.: US 8,374,017 B2
(45) Date of Patent: Feb. 12, 2013

(54) FERROELECTRIC MEMORY DEVICE AND METHOD WITH REFERENCE POTENTIAL CORRECTION CAPACITOR(S)

(75) Inventors: Ryousuke Takizawa, Kanagawa (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 540 days.

(21) Appl. No.: 12/559,447

(22) Filed: Sep. 14, 2009

(65) Prior Publication Data

US 2010/0103715 A1 Apr. 29, 2010

(30) Foreign Application Priority Data

Oct. 24, 2008 (JP) ................................. 2008-274621

(51) Int. Cl.
*G11C 11/22* (2006.01)
(52) U.S. Cl. .................... 365/145; 365/210.11
(58) Field of Classification Search ................ 365/145, 365/210.11
See application file for complete search history.

(56) References Cited

U.S. PATENT DOCUMENTS

| | | | | |
|---|---|---|---|---|
| 5,430,671 | A * | 7/1995 | Hirano et al. ................. | 365/145 |
| 5,515,312 | A * | 5/1996 | Nakakuma et al. ........... | 365/145 |
| 5,617,349 | A * | 4/1997 | Koike ........................... | 365/145 |
| 5,751,628 | A * | 5/1998 | Hirano et al. ................. | 365/145 |
| 6,356,475 | B1 * | 3/2002 | Tamura et al. ................ | 365/145 |
| 6,480,415 | B2 * | 11/2002 | Makuta et al. ........... | 365/185.09 |
| 6,493,251 | B2 * | 12/2002 | Hoya et al. ................... | 365/145 |
| 6,510,071 | B2 * | 1/2003 | Oowaki ........................ | 365/145 |
| 6,687,177 | B2 * | 2/2004 | Kurjanowicz ............ | 365/189.09 |
| 6,795,331 | B2 * | 9/2004 | Noro ............................ | 365/145 |

FOREIGN PATENT DOCUMENTS

JP 2001-250376 9/2001

OTHER PUBLICATIONS

Explanation of Non-English Language References.

* cited by examiner

*Primary Examiner* — Tuan T Nguyen
*Assistant Examiner* — Lance Reidlinger
(74) *Attorney, Agent, or Firm* — Knobbe, Martens, Olson & Bear, LLP

(57) ABSTRACT

A semiconductor storage device includes: a plurality of memory cell arrays, each having a memory cell arranged therein, the memory cell including a ferroelectric capacitor and a transistor; a dummy capacitor operative to provide a reference potential corresponding to a potential read from the memory cell; a sense amplifier circuit including an amplifier circuit to compare and amplify potentials between a pair of bit lines; a reference potential correction capacitor connected to the pair of bit lines together with the dummy capacitor; and a control circuit configured to output a correction signal based on shift information to correct the reference potential, the shift information being retained in at least one of the plurality of memory cell arrays. The reference potential correction capacitor shifts the reference potential by changing the amount of accumulated electric charges according to the correction signal.

15 Claims, 9 Drawing Sheets

US 8,374,017 B2

FERROELECTRIC MEMORY DEVICE AND METHOD WITH REFERENCE POTENTIAL CORRECTION CAPACITOR(S)

CROSS REFERENCE TO RELATED APPLICATIONS

This application is based on and claims the benefit of priority from prior Japanese Patent Application No. 2008-274621, filed on Oct. 24, 2008, the entire contents of which are incorporated herein by reference.

BACKGROUND OF THE INVENTION

1. Field of the Invention

The present invention relates to a semiconductor storage device and a method of operating the same, and in particular, to a semiconductor storage device with ferroelectric capacitors and a method of operating the same.

2. Description of the Related Art

Ferroelectric memory (FeRAM) is a semiconductor storage device that allows non-volatile storage of binary data based on two different magnitudes of polarization in a ferroelectric substance, using hysteresis characteristics of ferroelectric capacitors. Memory cells in a conventional ferroelectric memory include ferroelectric capacitors and transistors that are connected to each other (see, for example, Japanese Patent Laid-Open No. 2001-250376). The ferroelectric memory (FeRAM) includes a memory cell array having a plurality of memory cells arranged therein.

In the ferroelectric memory, a selection transistor, which is provided at an end of a memory cell array including a memory cell to be read, is selected and made conductive to connect the memory cell to a bit line. Then, plate voltage is applied to a plate line connected to the memory cell, and voltage is applied to each end of a ferroelectric capacitor included in the memory cell. Electric charges from the ferroelectric capacitor are read to the bit line, while a reference potential is applied to the other of a pair of bit lines (the complementary bit line) by a reference potential generation circuit. Then, the potentials of the pair of bit lines are compared and amplified by a sense amplifier. Thus, the difference between the amounts of electric charges read to the pair of bit lines represents the amount of signals.

The amount of signals is affected by the position of a memory cell array in the chip, and the parasitic capacitance of a word line, a bit line, and so on connected to the memory cell. In the ferroelectric memory, such impacts on the amount of signals read to the pair of bit lines are problematic because of reduction in the read operation margin.

SUMMARY OF THE INVENTION

One aspect of the present invention provides a semiconductor storage device comprising: a plurality of memory cell arrays, each having a memory cell arranged therein, the memory cell including a ferroelectric capacitor and a transistor, and each of the memory cell arrays having arranged therein a word line operative to select the memory cell, a plate line operative to apply drive voltage to the ferroelectric capacitor, and a pair of bit lines operative to read data from the ferroelectric capacitor of the memory cell; a selection transistor operative to selectively connect the memory cell arrays to one bit line included in the pair of bit lines; a dummy capacitor operative to provide a reference potential corresponding to a potential read from the memory cell to the other bit line included in the pair of bit lines; a sense amplifier circuit including an amplifier circuit to compare and amplify potentials between the pair of bit lines; a reference potential correction capacitor connected to the pair of bit lines together with the dummy capacitor; and a control circuit configured to output a correction signal based on shift information to correct the reference potential, the shift information being retained in at least one of the plurality of memory cell arrays, the reference potential correction capacitor shifting the reference potential by changing the amount of accumulated electric charges according to the correction signal.

Another aspect of the present invention provides a semiconductor storage device comprising: a plurality of memory cell arrays, each having a memory cell and a pair of bit lines arranged therein, the memory cell including a ferroelectric capacitor and a transistor, the pair of bit lines operative to read data from the ferroelectric capacitor of the memory cell; a dummy capacitor operative to provide a reference potential corresponding to a potential read from the memory cells to the pair of bit lines; a reference potential correction capacitor connected to the pair of bit lines; and a sense amplifier circuit including an amplifier circuit to compare and amplify potentials between the pair of bit lines, when a potential read from the memory cell is provided to one bit line included in the pair of bit lines, the reference potential correction capacitor shifting the reference potential provided to the other bit line included in the pair of bit lines.

Still another aspect of the present invention provides a method of operating a semiconductor storage device, the method comprising: reading data from a ferroelectric capacitor of a memory cell to one bit line included in a pair of bit lines, the memory cell including the ferroelectric capacitor and a transistor and being arranged in each of a plurality of memory cell arrays; providing, by a dummy capacitor, a reference potential corresponding to a potential read from the memory cell to the other bit line included in the pair of bit lines; outputting, by a control circuit, a correction signal based on shift information to correct a reference potential, the shift information being retained in at least one of the plurality of memory cell arrays; shifting, by a reference potential correction capacitor connected to the pair of bit lines, the reference potential by changing the amount of accumulated electric charges according to the correction signal; and comparing and amplifying, by a sense amplifier circuit, potentials between the pair of bit lines.

DETAILED DESCRIPTION OF THE EMBODIMENTS

Embodiments of the present invention will now be described below with reference to the accompanying drawings.

First Embodiment

Configuration of Semiconductor Storage Device in First Embodiment

Figure 1:
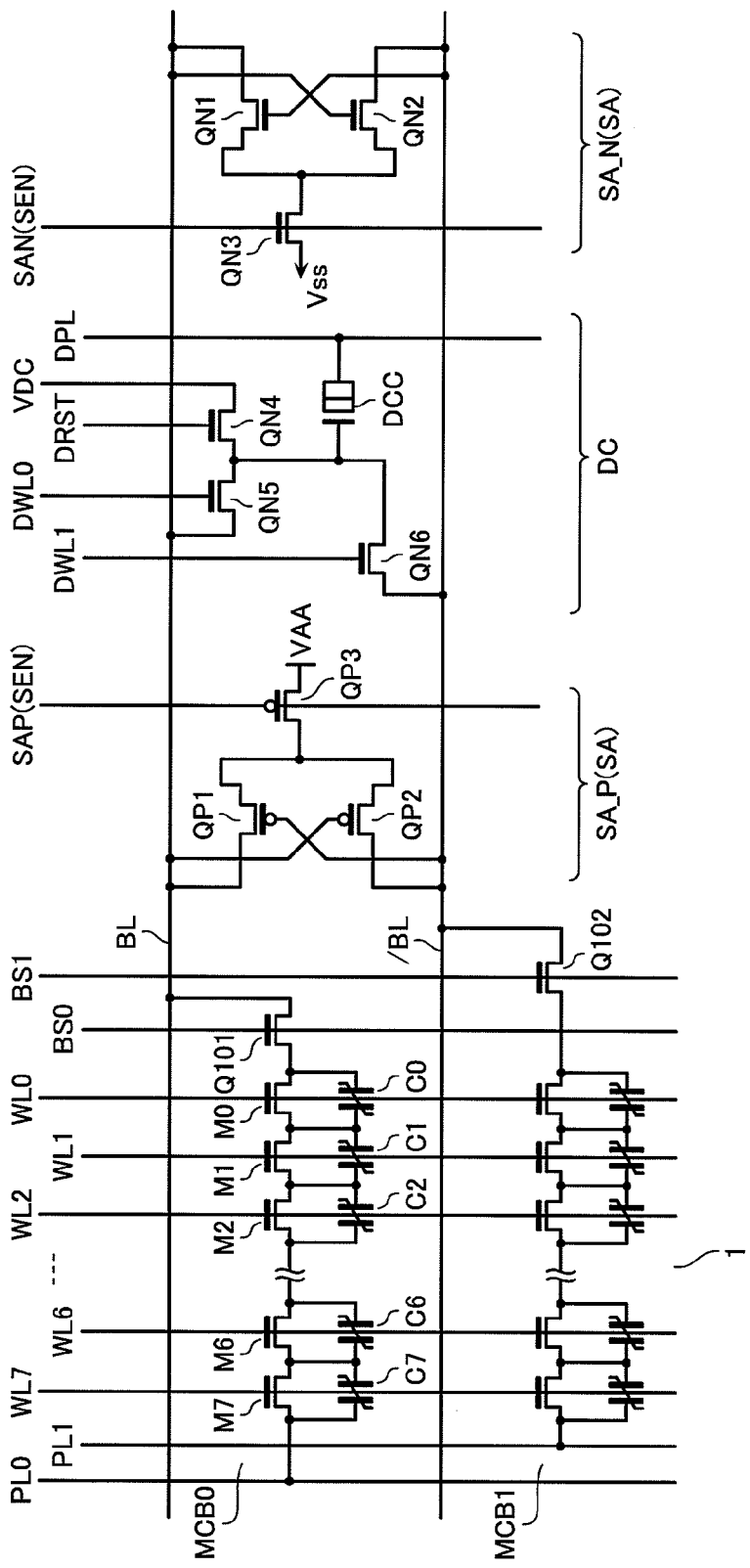
FIG. 1 illustrates a circuit configuration of a ferroelectric memory according to a first embodiment.

FIG. 1 illustrates a basic circuit configuration of a ferroelectric memory (FeRAM) according to a first embodiment of the present invention. The ferroelectric memory of this embodiment is a TC parallel unit serial connection type ferroelectric memory. A memory cell array 1 comprises memory cell blocks MCB0, MCB1, . . . , and so on, each of which has a plurality of (eight, in this case) memory cells connected in series. Each of the memory cells includes an n-type MOS transistor Mi (i=0 to 7) and a ferroelectric capacitor Ci (i=0 to 7) connected in parallel. FIG. 1 illustrates two memory cell blocks MCB0 and MCB1 connected to a pair of bit lines BL and /BL.

The plate electrodes of ferroelectric capacitors C7 located at one ends of the memory cell blocks MCB0 and MCB1 are connected to plate lines PL0 and PL1 for applying drive voltage. The other ends of the memory cell blocks MCB0 and MCB1 are connected via selection transistors Q101 and Q102 to the bit lines BL and /BL. The selection transistors Q101 and Q102 are on/off controlled by block selection signals BS0 and BS1.

During standby of the memory cell blocks MCB0 and MCB1, all word lines WLi (i=0 to 7) are set to "H" so that voltage is not applied to any ferroelectric capacitors Ci. However, for example, if the word line WL0 is only set to "L" for data read, then voltage is applied to each end of the ferroelectric capacitors C0. As a result, voltage based on the cell data retained in the ferroelectric capacitors C0 arises at the bit line BL or /BL, by which data is read.

The bit lines BL and /BL constitute a pair of bit lines for comparing a read potential that is read from a memory cell with a reference potential that is read from a dummy cell described below. That is, when a read potential is generated at one of the pair of bit lines BL and /BL, the other becomes the complementary bit line for generating a reference potential. The reference potential is set to an intermediate potential between the read potentials when reading "0" data and "1" data. In the ferroelectric memory illustrated in FIG. 1, setting any one of the block selection signals BS0 and BS1 to "H" allows only one of the memory cell blocks MCB0 and MCB1 to be connected to the bit line BL or /BL.

A dummy cell DC is provided as a configuration for generating the above-mentioned reference potential. The dummy cell DC comprises a reset transistor QN4, selection transistors QN5, QN6, and a dummy capacitor DCC. The selection transistor QN5 is connected between the bit line BL and one end of the dummy capacitor DCC, and the selection transistor QN6 is connected between the bit line /BL and one end of the dummy capacitor DCC. A dummy plate potential DPL is applied to the other end of the dummy capacitor DCC. In addition, dummy word lines DWL0 and DWL1 are connected to the gates of both selection transistors QN5 and QN6. Furthermore, the reset transistor QN4 has one end connected to one end of the dummy capacitor DCC, and the other end to which a reference potential VDC is provided. Thus, one end of the dummy capacitor DCC is reset to the reference potential VDC by a reset signal DRST. Any one of the dummy word lines DWL0 and DWL1 is selectively set to "H", depending upon which of the selection transistors Q101 and Q102 becomes conductive. That is, if the selection transistor Q101 becomes conductive and the memory cell block MCB0 is connected to the bit line BL, then the dummy word line DWL1 becomes "H", which causes a reference potential at the bit line /BL as the complementary bit line. Conversely, if the selection transistor Q102 becomes conductive and the memory cell block MCB1 is connected to the bit line /BL, then the dummy word line DWL0 becomes "H", which causes a reference potential at the bit line BL as the complementary bit line.

A sense amplifier SA is provided between the pair of bit lines BL and /BL that compares data in a memory cell with a reference potential, amplifies and retains the comparison result. The sense amplifier SA comprises a p-type sense amplifier SA_P including p-type MOS transistors QP1 to QP3 and an n-type sense amplifier SA_N including n-type MOS transistors QN1 to QN3. Operations of the p-type sense amplifier SA_P and the n-type sense amplifier SA_N are controlled by sense amplifier enabling signals SAN and SAP, respectively. The two sense amplifier enabling signals SAN and SAP may be hereinafter referred to as a "sense amplifier enabling signal SEN".

The p-type MOS transistors QP1 and QP2 included in the p-type sense amplifier SA_P are connected in series between the pair of bit lines BL and /BL, and have their gates connected to the pair of bit lines /BL and BL, respectively. Thereby, the p-type MOS transistors QP1 and QP2 configure a flip-flop circuit. In addition, the p-type MOS transistor QP3 is connected between a point to which both transistors QP1 and QP2 are commonly connected and the power supply voltage VAA. A sense amplifier enabling signal SAP is supplied to the gate of the p-type MOS transistor QP3 for on/off control of the p-type sense amplifier SA_P.

The n-type MOS transistors QN1 and QN2 included in the n-type sense amplifier SA_N are connected in series between the pair of bit lines BL and /BL, and have their gates connected to the pair of bit lines /BL and BL, respectively. Thereby, the n-type MOS transistors QN1 and QN2 configure a flip-flop circuit. In addition, the n-type MOS transistor QN3 is connected between a point to which both transistors QN1 and QN2 are commonly connected and the ground potential Vss. A sense amplifier enabling signal SAN is supplied to the gate of the n-type MOS transistor QN3 for on/off control of the n-type sense amplifier SA_N.

The data that is read from a memory cell to the pair of bit lines BL and /BL is compared and amplified at the sense amplifier circuit SA, and then output to the outside.

Figure 2:
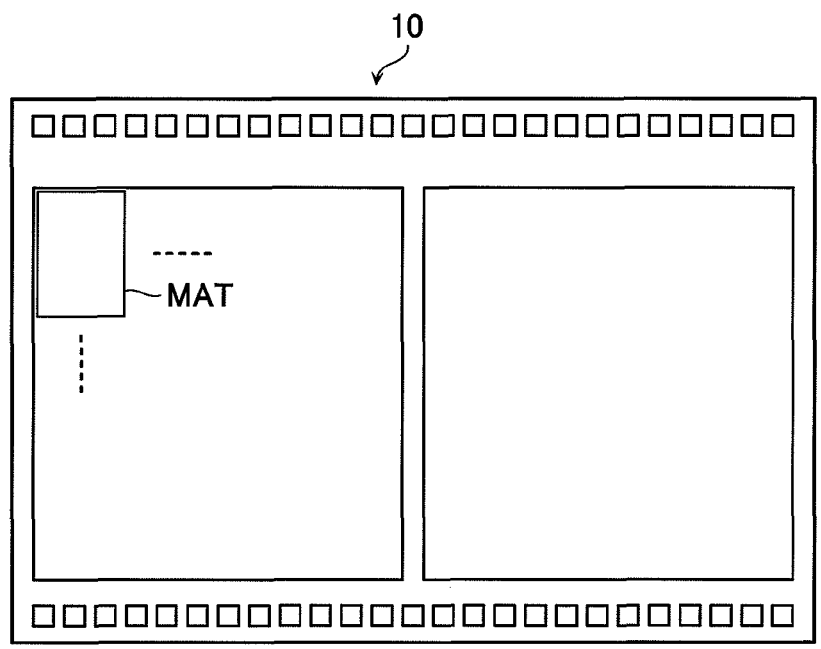
FIG. 2 is a plan view generally illustrating a chip on which the ferroelectric memory according to the first embodiment is formed.
Figure 3:
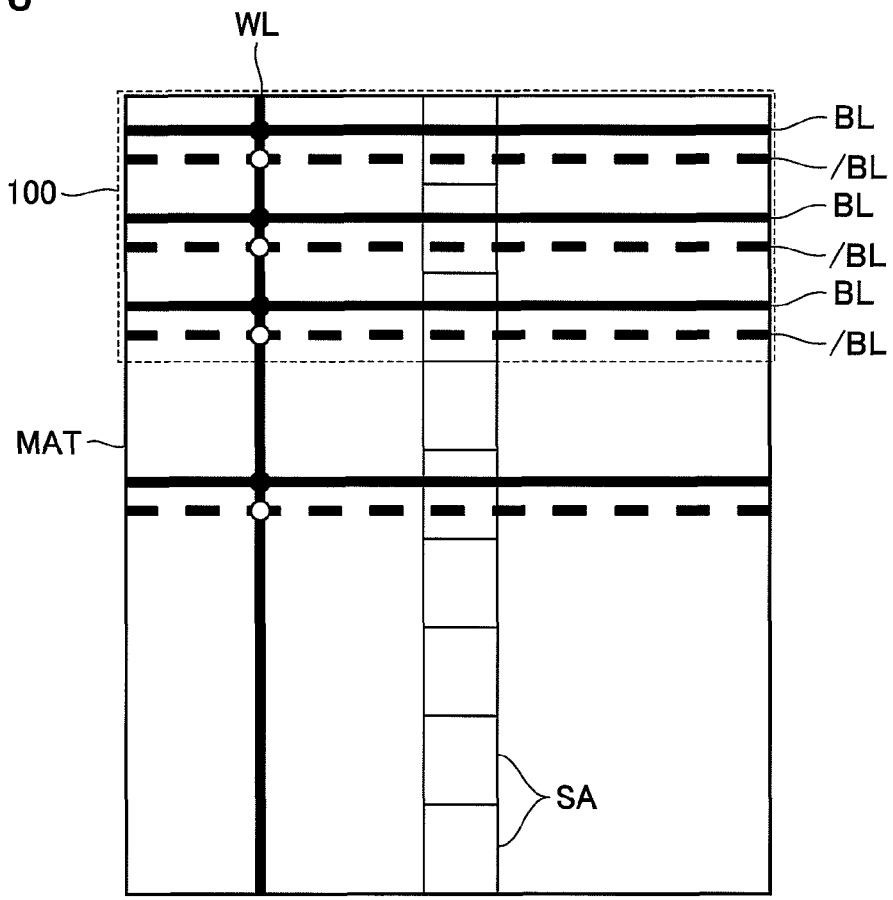
FIG. 3 is an enlarged plan view of the chip on which the ferroelectric memory according to the first embodiment is formed.

FIG. 2 is a plan view generally illustrating a chip on which the ferroelectric memory according to the first embodiment of the present invention is formed. FIG. 3 is an enlarged plan view of a cell array mat MAT in the chip 10 on which the ferroelectric memory illustrated in FIG. 2 is formed.

Provided on the chip 10 illustrated in FIG. 2 are, for example, multiple memory cell arrays 1 as illustrated in FIG.

1, sense amplifiers SA associated with the respective memory cell arrays 1, and so on. In this embodiment, such an area in the chip 10 is referred to as a "cell array mat MAT" wherein a certain number of memory cell arrays 1, sense amplifiers SA, dummy cells DC, and so on, are formed.

FIG. 3 is an enlarged view typically illustrating one of the cell array mats MAT. FIG. 3 illustrates the area in which a word line WL, pairs of bit lines BL and /BL, and sense amplifiers SA connected to the pairs of bit lines BL and /BL are formed, omitting the detailed configuration of the memory cell blocks MCB.

Each cell array mat MAT has a shift information storage area 100 provided therein for storing shift information. In this embodiment, it is assumed that a part indicated by the broken line in FIG. 3 represents the shift information storage area 100. As used herein, the term "shift information" refers to such information that is used for shifting the value of a reference potential by adding or subtracting a certain value of potential to or from the reference potential applied to any one of the pair of bit lines BL and /BL, when reading information from a memory cell. Using the reference potential with the value being changed based on the shift information, a sense amplifier SA of the ferroelectric memory reads data retained in memory cells.

The respective memory cells from which data is read are connected to different word lines WL depending upon their positions in the memory cell array 1. Each shift information storage area 100 in the ferroelectric memory of this embodiment stores shift information for reference potential correction. The shift information is based on the positions of the word lines WL to which the corresponding memory cells are connected.

Figure 4:
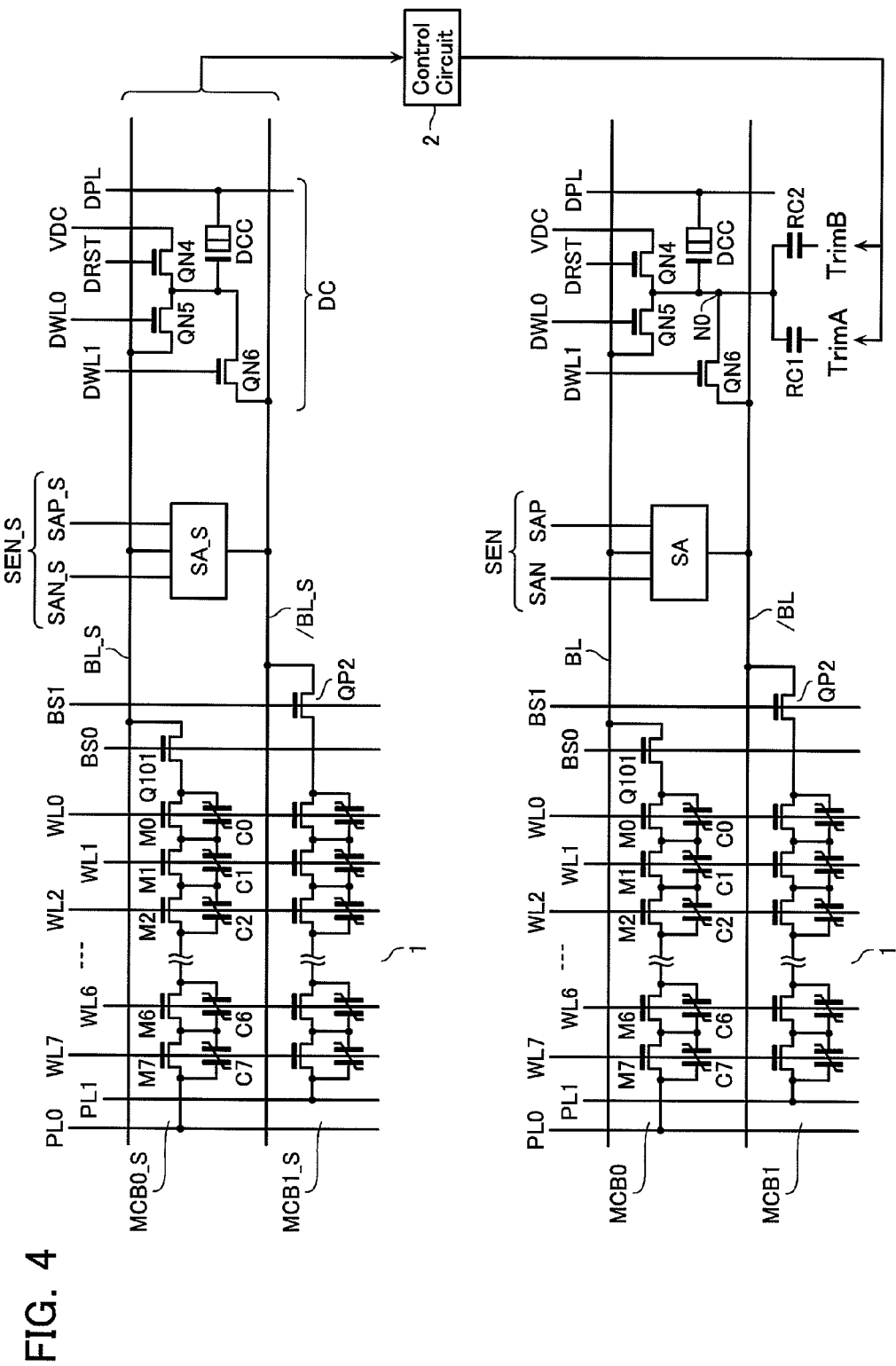
FIG. 4 is a schematic diagram illustrating a read circuit on a cell array mat of the ferroelectric memory according to the first embodiment.

FIG. 4 schematically illustrates a read circuit on the cell array mat MAT illustrated in FIG. 3. In FIG. 4, the same reference numerals represent the same components as FIG. 1, and description thereof will be omitted. The upper section of FIG. 4 illustrates a configuration of the shift information storage area 100 in the cell array mat MAT, and the lower section of FIG. 4 illustrates a configuration of a memory area used for retaining normal information. A sense amplifier in the shift information storage area 100 is labeled as SA_S, and a sense amplifier in the memory area as SA. The sense amplifier SA_S controls the reading of shift information with a sense amplifier enabling signal SEN_S (signals SAN_S and SAP_S). In addition, the sense amplifier SA controls the reading of information retained in the memory area with the sense amplifier enabling signal SEN (signals SAN and SAP).

Furthermore, memory cell blocks are indicated by MCB0_S and MCB1_S, and a pair of bit lines as BL_S and /BL_S in the shift information storage area 100.

In the ferroelectric memory illustrated in FIG. 4, the shift information read from the shift information storage area 100 is transferred to the memory area as a correction signal. The ferroelectric memory of this embodiment has a control circuit 2 provided therein that outputs correction signals TrimA and TrimB to the memory area based on the shift information read from the pair of bit lines in the shift information storage area 100. The control circuit 2 sets the correction signals TrimA and TrimB to "H" or "L" state, which in turn are supplied to reference potential correction capacitors RC1 and RC2 provided in the memory area. In this case, it is assumed for the ferroelectric memory of this embodiment that one memory cell from which data is read and another memory cell in the shift information storage area 100 having the shift information for correcting the reference potential when reading data from the one memory cell are connected to the same word line (e.g., word line WL0).

The reference potential correction capacitors RC1 and RC2, which are provided in the memory area, are connected in parallel to a node N0 to which a dummy capacitor DCC is connected. The correction signals TrimA and TrimB are in "H" state or "L" state. These correction signals TrimA and TrimB change the amount of electric charges to be retained in the reference potential correction capacitors RC1 and RC2. Accordingly, the potential of the node N0 as well as the reference potential to be applied to one of the pair of bit lines BL and /BL are also changed. The reference potential applied to one of the pair of bit lines BL and /BL is corrected by controlling the correction signals TrimA and TrimB with the shift information. The control circuit 2 outputs different correction signals to the reference potential correction capacitors RC, based on the shift information. The different correction signals are input to the reference potential correction capacitors RC depending on the selected word line.

(Operation of Semiconductor Storage Device in First Embodiment)

Figure 5:
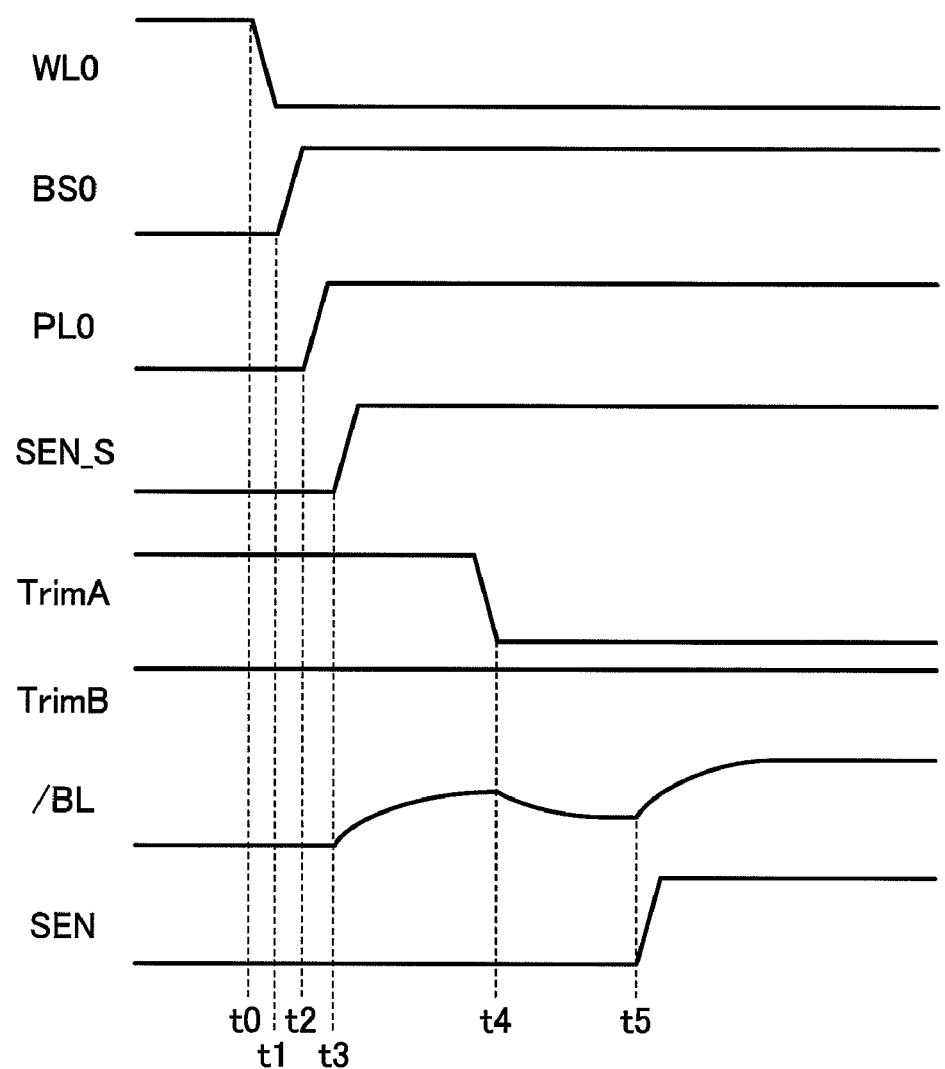
FIG. 5 is a timing chart illustrating an operation of the ferroelectric memory according to the first embodiment.

Referring now to the timing chart of FIG. 5, an operation of the ferroelectric memory of this embodiment will be described below.

At time t0, in reading data, the word line WL0 is set to "L" in order to select a cell to be read, e.g., a memory cell having the ferroelectric capacitor C0 in the memory cell block MCB0.

Then, at time t1, the block selection signal BS0 of the selection transistor Q101 is set to "H", and the memory cell blocks MCB0 and MCB0_S are connected to the bit lines BL and BL_S, respectively.

At time t2, the plate line PL0 connected to the memory cell blocks MCB0 and MCB0_S is set from Vss to VAA (the voltage applied to a capacitor), and a voltage VAA is then applied to each end of the ferroelectric capacitor C0 in the cell to be read. As a result, electric charges from the ferroelectric capacitor C0 are read to the bit lines BL and BL_S.

On the other hand, the reference potential is applied by the dummy cell DC to the bit lines /BL and /BL_S as the complementary bit lines that are paired with the bit lines BL and BL_S, respectively.

At time t3, the sense amplifier enabling signal SEN_S, which is provided to the sense amplifier SA_S in the shift information storage area 100, is switched to drive the sense amplifier SA_S. Then, the potentials of the bit lines BL_S and /BL_S are compared and amplified. At this point, the sense amplifier enabling signal SEN, which is provided to the sense amplifier SA in the memory area, still remains "L", and hence the sense amplifier SA in the memory area is not driven.

Then, by time t4, the shift information is differentially amplified and read by the sense amplifier SA_S, and correction signals TrimA and TrimB are output to a reference potential correction capacitor in the memory area via the control circuit 2. In this embodiment, the correction signal TrimA is changed from "H" state to "L" state. On the other hand, the correction signal TrimB remains "H" state. This change from "H" to "L" state of the correction signal TrimA that is input to the capacitor reduces the potential of the bit line /BL to which the reference potential is applied.

At time t5, the sense amplifier enabling signal SEN, which is provided to the sense amplifier SA in the memory area, is switched to drive the sense amplifier SA. Then, the potentials of the bit lines BL and /BL are compared and amplified. As a result, the information stored in the memory area is read.

(Advantages of Semiconductor Storage Device in First Embodiment)

According to this embodiment, the shift information stored in the shift information storage area 100 is first read, and the reference potential in the memory area is then corrected by the correction signals TrimA and TrimB based on the shift information. While the reference potential varies that is required for reading data from the memory cells connected to different word lines in the memory area, a large read operation margin may be reserved by correcting the reference potential based on the shift information.

Figure 10:
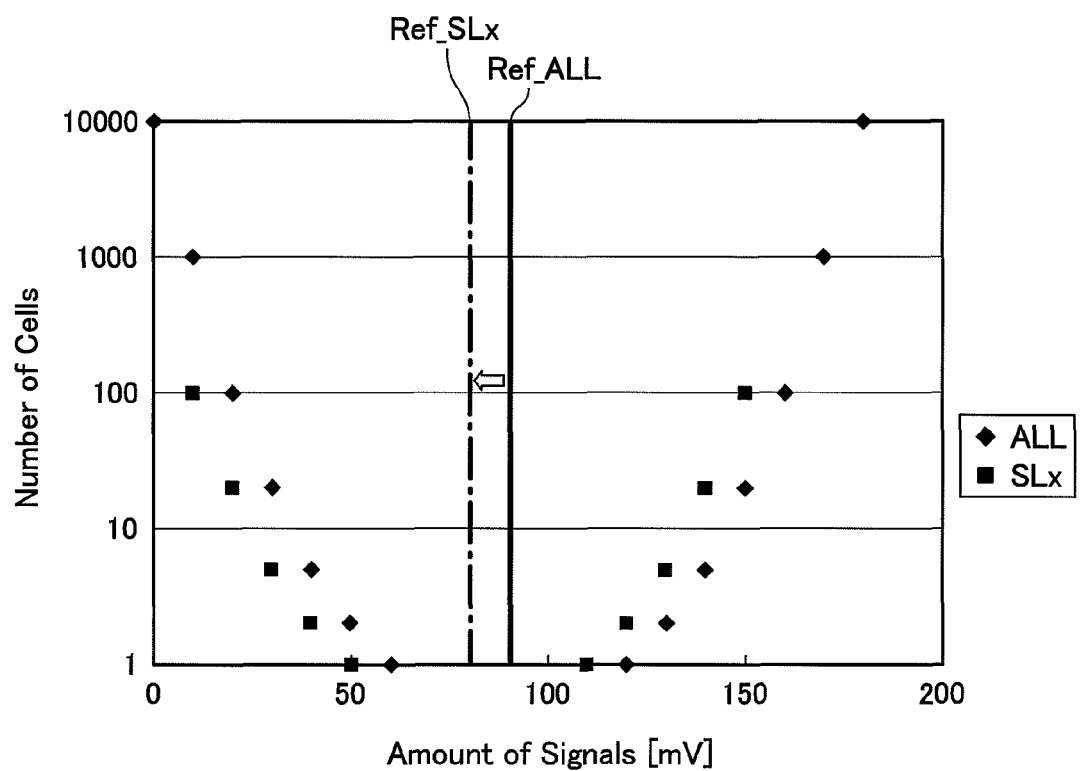
FIG. 10 is a graph for explaining reference potential correction of a ferroelectric memory according to an embodiment.

In this case, the above-mentioned shift information can be determined at factory tests. FIG. 10 is a graph illustrating the test results of the die sort test. There are illustrated two labels in two plots: "ALL" represents data of the memory cells in the entire chip 10, and "SLx" represents data of a memory cell that is connected to a particular word line WL in a certain memory cell array 1. The right side of the graph illustrates the number of memory cells with, e.g., "1" data, and the amount of signals, while the left side illustrates the number of memory cell switch, e.g., "0" data, and the amount of signals. A reference potential Ref_ALL is set to an intermediate potential between the potentials for the amount of signals when reading "0" data and "1" data. The reference potential Ref_ALL may be obtained from: a middle point between one of the memory cells with "0" data that has the largest amount of signals and one of the memory cells with "1" data that has the smallest amount of signals, a point resulting from extrapolation of the gradient of the graph by a certain function, e.g., by fitting a normal probability and performing a first-order approximation, and so on. The margin is reserved for reading signals "0" and "1" by setting the reference potential Ref_ALL to an intermediate potential between the potentials for the amount of signals when reading "0" data and "1" data. Similarly, a reference potential Ref_SLx may be calculated from data SLx of a memory cell connected to a particular word line WL so that the margin is reserved for reading signals "0" and "1" from the memory cell connected to the particular word line WL.

By a test for multiple reference potentials, the failed-bit information for the respective reference potentials is output. Based on the information, an optimal reference potential Ref_SLx is calculated for each selected word line WL in the cell array. Then, the difference between the reference potential Ref_ALL obtained from the memory cells in the entire memory cell array and the reference potential Ref_SLx may be taken as the shift information. In the shift information storage area 100, a memory cell of 1 bit may be created by two capacitors for writing complementary data to the pair of bit lines BL and /BL, which may improve the margin for reading the shift information. That is, each memory cell in which the shift information is stored may be configured as 2T2C type.

Second Embodiment

Configuration of Semiconductor Storage Device in Second Embodiment

Figure 6:
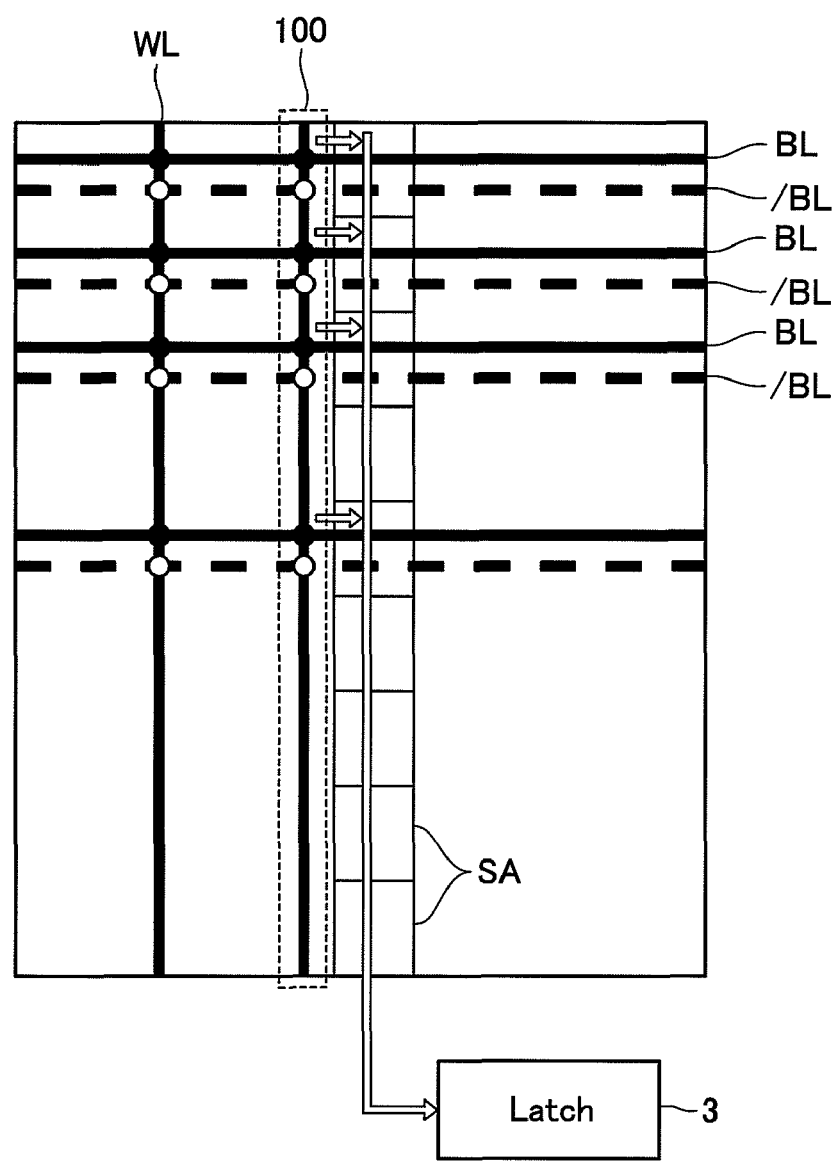
FIG. 6 is an enlarged plan view of a chip on which a ferroelectric memory according to a second embodiment is formed.
Figure 7:
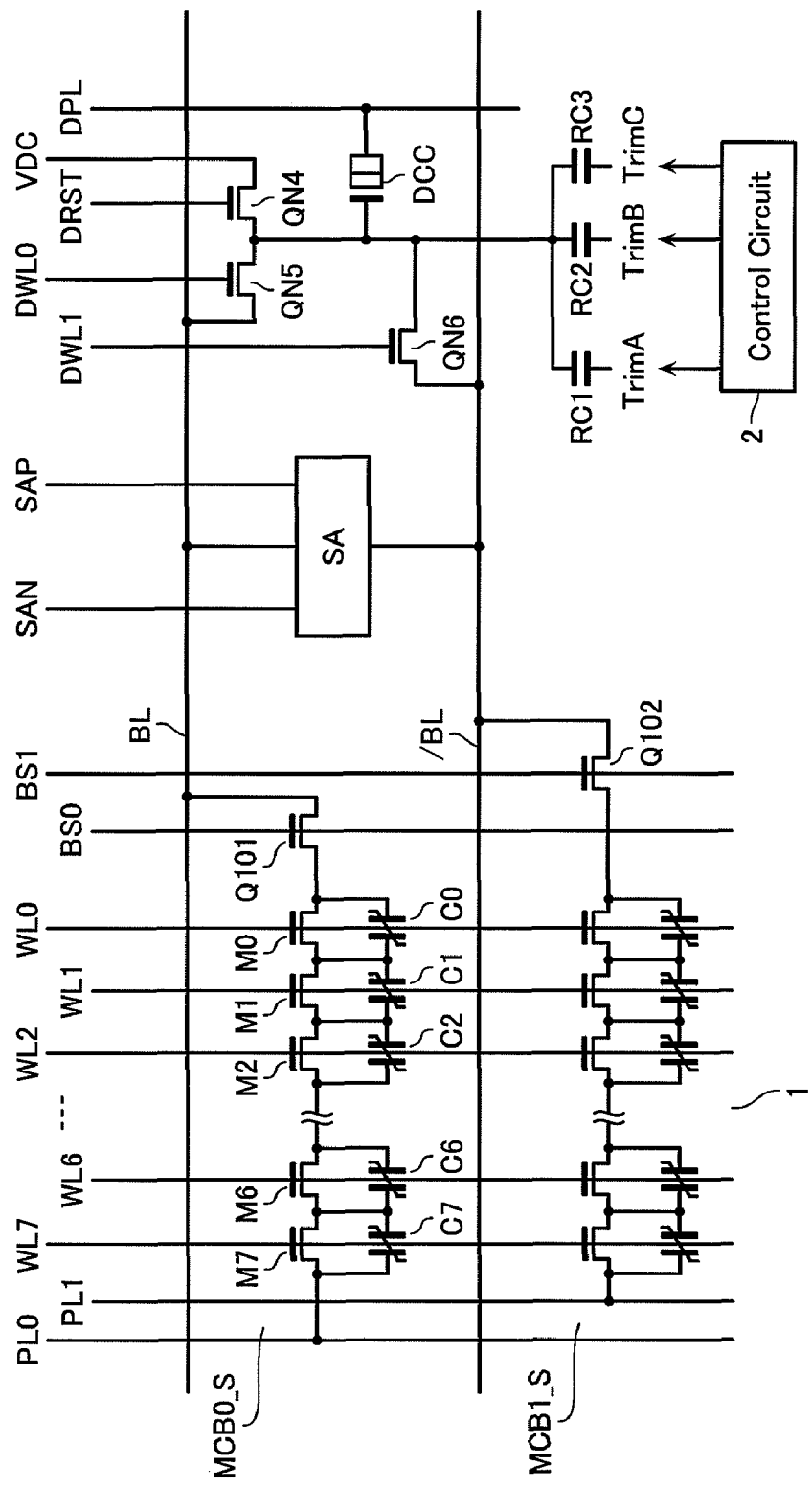
FIG. 7 is a schematic diagram illustrating a read circuit on a cell array mat of the ferroelectric memory according to the second embodiment.

A second embodiment of the present invention will now be described below. FIG. 6 is an enlarged plan view of the chip 10 on which the ferroelectric memory of this embodiment is formed. FIG. 7 schematically illustrates a read circuit on the cell array mat MAT illustrated in FIG. 6.

In the ferroelectric memory of this embodiment, the basic configuration of the cell array mat MAT, the memory cell array 1, etc., is the same as the ferroelectric memory of the first embodiment mentioned above.

The ferroelectric memory of this embodiment is different from that of the first embodiment in the area of the cell array mat MAT where the shift information storage area 100 is set. In the ferroelectric memory of the second embodiment, the memory cells included in the shift information storage area 100 are connected to certain word lines in the cell array mat MAT. In addition, the ferroelectric memory of this embodiment has a latch circuit 3 for retaining the shift information read from the shift information storage area 100.

(Operation of Semiconductor Storage Device in Second Embodiment)

The ferroelectric memory of this embodiment reads shift information, for example, when the ferroelectric memory is powered on.

When the ferroelectric memory is powered on, the word lines WL connected to the shift information storage area 100 are activated, and then the shift information is sequentially read from the shift information storage area 100 in each memory cell array 1. The read shift information is compared and amplified by the sense amplifier SA and then transferred to the latch circuit 3 that is provided external to the cell array mat MAT.

The information retained at the latch circuit 3 is transferred to the control circuit, and the correction signals TrimA, TrimB and TrimC based on the shift information are provided from the control circuit 2 to the reference potential correction capacitors RC1, RC2 and RC3 that are connected to a dummy cell DC in the cell array mat MAT.

The reference potential correction capacitors RC1, RC2 and RC3 are connected in parallel to a node N0 to which a dummy capacitor DCC is connected. The correction signals TrimA, TrimB and TrimC are in "H" state or "L" state. These correction signals TrimA, TrimB and TrimC change the amount of electric charges to be retained in the reference potential correction capacitors. Accordingly, the potential of the node N0 as well as the reference potential to be applied to one of the pair of bit lines BL and /BL are also changed. The reference potential applied to one of the pair of bit lines BL and /BL is corrected by controlling the correction signals TrimA, TrimB and TrimC with the shift information. According to the ferroelectric memory of this embodiment, the control circuit 2 outputs different correction signals to the reference potential correction capacitors RC1, RC2 and RC3 for different cell array mats MAT, based on the shift information transferred from the latch circuit 3.

In this embodiment, the reference potential correction capacitors RC1, RC2 and RC3 provided in one cell array mat MAT are provided with the same correction signal. In addition, the reference potential correction capacitors RC1, RC2 and RC3 provided in another cell array mat MAT are provided with another correction signal. This allows reference potential correction to be performed for each cell array mat MAT.

In this embodiment, the shift information that is stored in the shift information storage area 100 and output from the latch circuit 3 may include information, such as indicating whether to perform reference potential correction for that cell array mat MAT, whether to increase or decrease the reference potential, or the like.

(Advantages of Semiconductor Storage Device in Second Embodiment)

In the ferroelectric memory of this embodiment, the shift information stored in the shift information storage area 100 is first read, and the reference potential is then corrected for each cell array mat MAT by the correction signals TrimA, TrimB and TrimC based on the shift information. While the reference potential that is required for reading data from the memory cells also varies depending upon the positions of the cell array mats MAT in the chip 10, a large read operation margin may be reserved by correcting the reference potential based on the shift information.

Third Embodiment

Configuration of Semiconductor Storage Device in Third Embodiment

Figure 8:
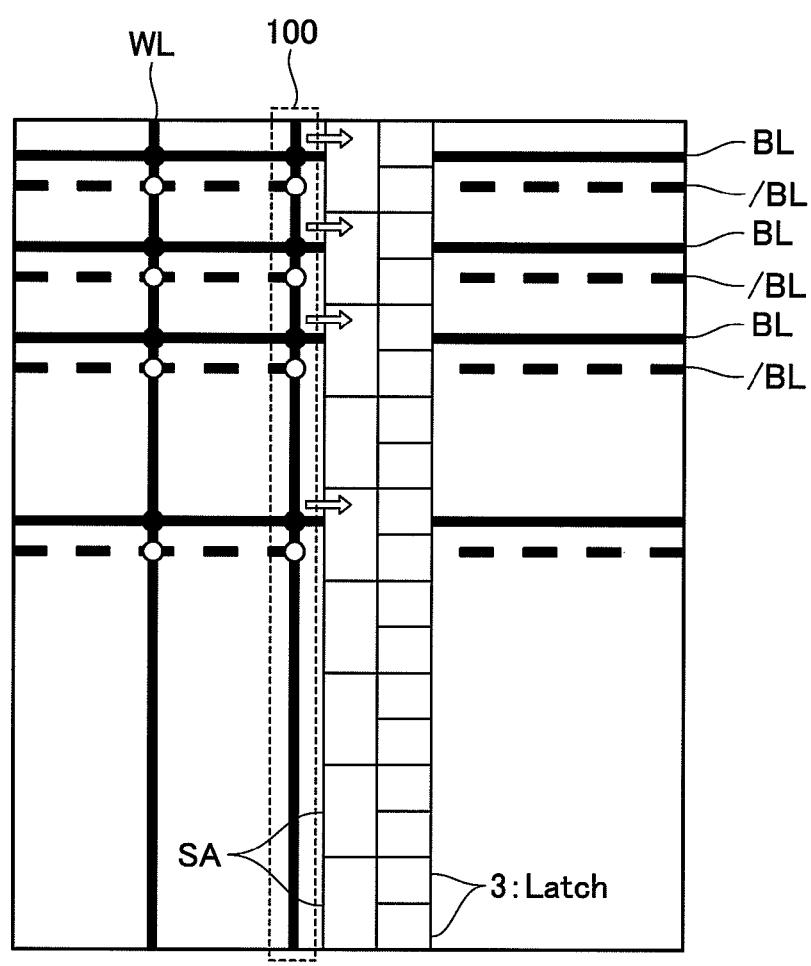
FIG. 8 is an enlarged plan view of a chip on which a ferroelectric memory according to a third embodiment is formed.
Figure 9:
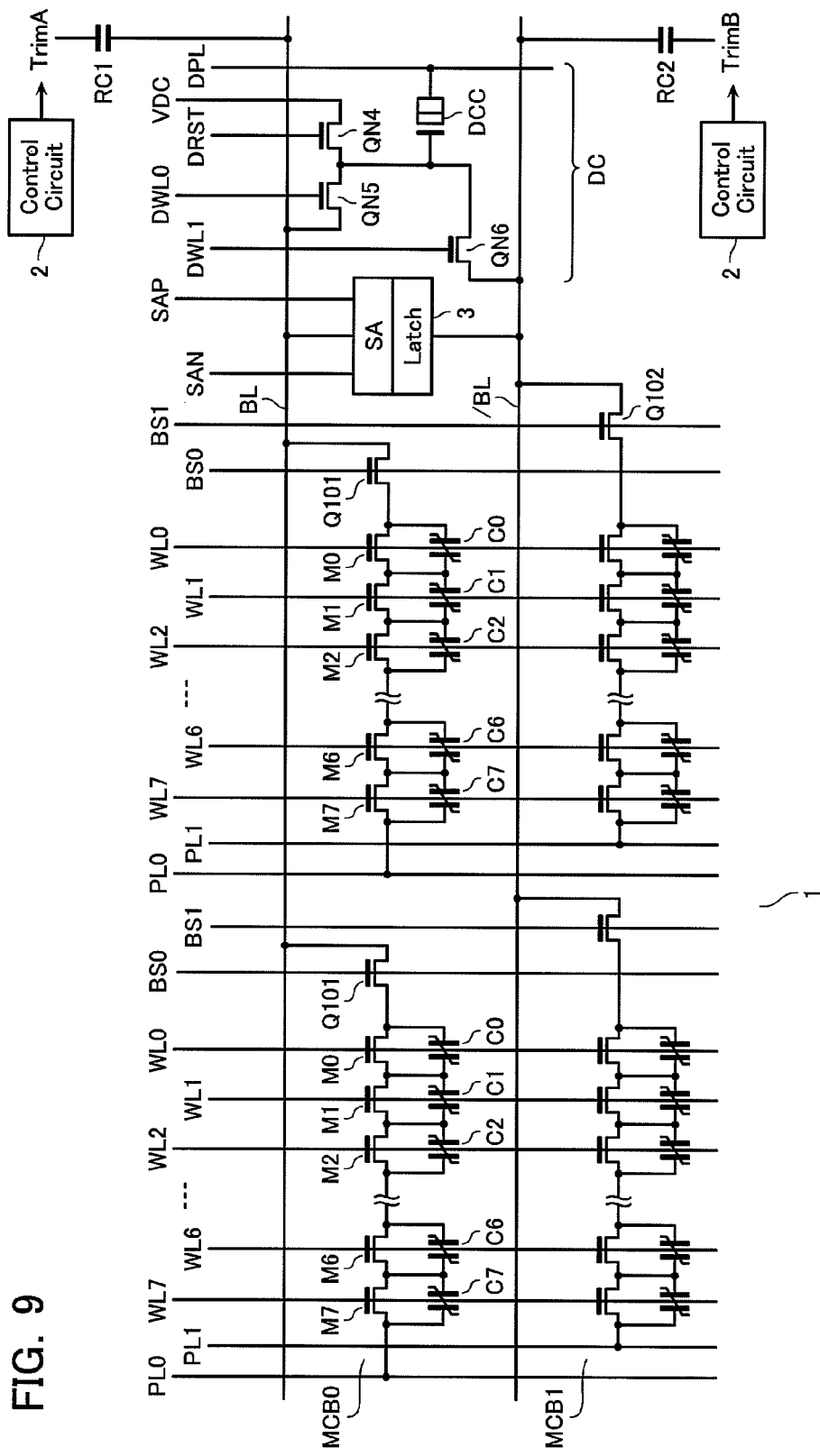
FIG. 9 is a schematic diagram illustrating a read circuit on a cell array mat of the ferroelectric memory according to the third embodiment.

A third embodiment of the present invention will now be described below. FIG. 8 is an enlarged plan view of the chip 10 on which the ferroelectric memory of this embodiment is formed. FIG. 9 schematically illustrates a read circuit on the cell array mat MAT illustrated in FIG. 8.

In the ferroelectric memory of this embodiment, the basic configuration of the memory cell array 1, and so on, is the same as the ferroelectric memory of the first embodiment mentioned above.

In the ferroelectric memory of the third embodiment, the memory cells included in the shift information storage area 100 are connected to certain word lines in the cell array mat MAT, as in the second embodiment. In addition, the ferroelectric memory of this embodiment is different from that of the second embodiment in that latch circuits 3 are provided for respective sense amplifiers SA for retaining the shift information read from the shift information storage area 100.

(Operation of Semiconductor Storage Device in Third Embodiment)

The ferroelectric memory of this embodiment reads shift information, for example, when the ferroelectric memory is powered on.

When the ferroelectric memory is powered on, the word lines WL connected to the shift information storage area 100 are activated, and then the shift information is sequentially read from the shift information storage area 100 in each memory cell array 1. The read shift information is compared and amplified by the sense amplifier SA and then retained in a latch circuit 3.

The reference potential is corrected for each bit line in the memory cell array 1 according to the information retained at the latch circuit 3. That is, the information is transferred from the latch circuit 3 to shift information control circuits 2, and the correction signals TrimA and TrimB based on the shift information are provided to the reference potential correction capacitors RC1 and RC2 that are connected to a dummy cell DC in the cell array mat MAT.

The reference potential correction capacitors RC1 and RC2 are connected to each of the bit lines BL and /BL of respective memory cell arrays. The correction signals TrimA and TrimB are in "H" state or "L" state. These correction signals TrimA and TrimB change the amount of electric charges to be retained in the reference potential correction capacitors. Accordingly, the potentials of the bit lines BL and /BL as well as the reference potential to be applied to one of the pair of bit lines BL and /BL are also individually changed. The reference potential applied to one of the pair of bit lines BL and /BL is corrected by controlling the correction signals TrimA and TrimB with the shift information. In the ferroelectric memory of this embodiment, the control circuit 2 outputs different correction signals to the reference potential correction capacitors RC1 and RC2 for each of the pair of bit lines BL and /BL, based on the shift information transferred from the latch circuit 3.

In this embodiment, the correction signals are supplied to the reference potential correction capacitors RC1 and RC2 that are provided for each of the bit lines BL and /BL in the memory cell array. This allows reference potential correction to be performed for each of the bit lines BL and /BL.

In this embodiment, the correction information that is stored in the shift information storage area 100 and output from the latch circuit may include information, such as indicating whether to perform reference potential correction for that cell array mat MAT, whether to increase or decrease the reference potential, or the like.

(Advantages of Semiconductor Storage Device in Third Embodiment)

In the ferroelectric memory of this embodiment, the shift information stored in the shift information storage area 100 is first read, and the reference potential is then corrected by the correction signals TrimA and TrimB based on the shift information. The reference potential required for reading data varies, depending upon the capacitance imbalance between a pair of bit lines BL and /BL for each column, dispersion of threshold voltage of transistors included in a sense amplifier SA, and so on. However, a large read operation margin may be reserved by correcting the reference potential of each bit line based on the shift information.

While embodiments of the present invention have been described, the present invention is not intended to be limited to the disclosed embodiments, and various other changes, additions or the like may be made thereto without departing from the spirit of the invention. For example, although the disclosed embodiments involve the configurations where the reference potential is corrected for each memory cell array 1, for each cell array mat MAT, or for each bit line, any combination thereof may be used.

What is claimed is:

1. A semiconductor storage device comprising:
   a plurality of arrays of memory cells, each memory cell including a ferroelectric capacitor and a transistor, the plurality of memory cell arrays comprising:
      word lines operative to select memory cells in the array,
      plate lines operative to apply drive voltage to the ferroelectric capacitors in the array, and
      a pair of bit lines operative to read data from the ferroelectric capacitors in the array;
   a selection transistor operative to selectively connect a memory cell block to one bit line of the pair of bit lines;
   a dummy capacitor operative to provide a reference voltage to another bit line of the pair of bit lines, the reference voltage having a value between signals that may be read from the memory cell;
   a sense amplifier circuit to compare and amplify potentials between the bit lines of the pair of bit lines;
   a reference potential correction capacitor connected to the pair of bit lines together with the dummy capacitor; and
   a control circuit configured to output a correction signal based on shift information to correct the reference potential, the shift information being retained in at least one of the plurality of memory cell arrays,
   the reference potential correction capacitor shifting the reference potential by changing the amount of accumulated electric charges according to the correction signal.

2. The device of claim 1, wherein
   the control circuit is configured to output different correction signals based on the shift information to the reference potential correction capacitor depending on the word line to be selected.

3. The device of claim 2, wherein
   the shift information is read from a first memory cell in the memory cell arrays that stores the shift information, the first memory cell being connected to the same word line as a second memory cell from which data is read.

4. The device of claim 1, further comprising:

a plurality of cell array mats each including a certain number of the memory cell arrays; and a plurality of latch circuits, each of which is provided for each of the cell array mats to retain the shift information, wherein the control circuit is configured to output a different correction signal to the reference potential correction capacitor for each of the cell array mats, based on the shift information transferred from each of the latch circuits.

5. The device of claim 4, wherein each of the latch circuits is configured to retain the shift information read from one of the memory cell arrays when the semiconductor storage device is powered on.

6. The device of claim 4, wherein the shift information is stored in a shift information storage area provided for each of the cell array mats.

7. The device of claim 1, further comprising a plurality of latch circuits, each latch circuit being provided for each of the pair of bit lines to retain the shift information, wherein at least one reference potential correction capacitor is provided for each of the pair of bit lines, and the control circuit is configured to output a different correction signal to the at least one reference potential correction capacitor for each of the bit lines, based on the shift information transferred from each of the latch circuits.

8. The device of claim 1, wherein the memory cell is formed with the ferroelectric capacitor and the transistor connected in parallel, and the memory cell block has a plurality of the memory cells connected in series with one end connected to the plate line and the other end connected to the pair of bit lines via the selection transistor.

9. The device of claim 1, wherein a plurality of the reference potential correction capacitors are provided at one bit line of the pair of bit lines.

10. The device of claim 9, wherein different correction signals are input to different reference potential correction capacitors.

11. A method of operating a semiconductor storage device, the method comprising:

reading data from a ferroelectric capacitor of a memory cell to one bit line of a pair of bit lines, the memory cell including the ferroelectric capacitor and a transistor and being arranged in each of a plurality of memory cell arrays;

providing, by a dummy capacitor, a reference voltage to another bit line of the pair of bit lines, the reference voltage having a value between signals that may be read from the memory cell;

outputting, by a control circuit, a correction signal based on shift information to correct a reference potential, the shift information being retained in at least one of the plurality of memory cell arrays;

shifting, by a reference potential correction capacitor connected to the pair of bit lines, the reference potential by changing the amount of accumulated electric charges of the correction signal; and comparing and amplifying, by a sense amplifier circuit, potentials between the pair of bit lines.

12. The method of claim 11, wherein shifting the reference potential comprises shifting, by the reference potential correction capacitor, the reference potential to a different value depending on the word line to be selected.

13. The method of claim 11, wherein the semiconductor storage device further comprises a plurality of cell array mats each including a certain number of the memory cell arrays; and shifting the reference potential comprises shifting, by the reference potential correction capacitor, the reference potential to a different value for each of the cell array mats.

14. The method of claim 11, wherein shifting the reference potential comprises shifting, by the reference potential correction capacitor provided for each of the pair of bit lines, the reference potential to a different value for each of the bit lines.

15. The method of claim 11, wherein shifting the reference potential is performed by a plurality of the reference potential correction capacitors provided for one bit line of the pair of bit lines.

* * * * *